United States Patent [19]

Bandou et al.

[11] Patent Number: 5,903,048

[45] Date of Patent: *May 11, 1999

[54] LEAD FRAME FOR SEMICONDUCTOR DEVICE

[75] Inventors: Kouji Bandou; Akiyoshi Sawai; Hideki Hukunaga, all of Tokyo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/859,291

[22] Filed: May 20, 1997

[30] Foreign Application Priority Data

Nov. 13, 1996  [JP]  Japan ..................... 8-301446

[51] Int. Cl.⁶ .................................................. H01L 23/495
[52] U.S. Cl. ........................ 257/676; 257/670; 257/672; 257/692
[58] Field of Search ..................... 257/666, 670, 257/676, 690, 692, 693, 694, 734, 735, 672, 674, 797

[56] References Cited

U.S. PATENT DOCUMENTS

| 4,796,078 | 1/1989 | Phelps, Jr. et al. ............... 357/68 |
|---|---|---|
| 4,942,452 | 7/1990 | Kitano et al. ..................... 357/68 |
| 5,150,193 | 9/1992 | Yasuhara et al. .................. 357/70 |
| 5,336,927 | 8/1994 | Suetake ............................ 257/670 |
| 5,378,656 | 1/1995 | Kajihara et al. .................. 437/217 |
| 5,424,576 | 6/1995 | Djennas et al. ................... 257/666 |
| 5,451,813 | 9/1995 | Kazutaka .......................... 257/676 |
| 5,610,437 | 3/1997 | Frechette ......................... 257/670 |
| 5,623,123 | 4/1997 | Umehara ........................... 174/52.2 |
| 5,637,913 | 6/1997 | Kajihara et al. .................. 257/666 |
| 5,646,829 | 7/1997 | Sota ................................ 361/813 |
| 5,661,338 | 8/1997 | Yoo et al. ......................... 257/676 |

FOREIGN PATENT DOCUMENTS

| 50-137968 | 11/1975 | Japan . |
|---|---|---|
| 56-161356 | 12/1981 | Japan . |
| 60-72236 | 4/1985 | Japan . |
| 36148850 | 7/1986 | Japan ..................... 257/666 |

*Primary Examiner*—Valencia Martin-Wallace
*Assistant Examiner*—George C. Eckert, II
*Attorney, Agent, or Firm*—Leydig, Voit & Mayer

[57] ABSTRACT

A lead frame including a holding portion having an area smaller than a semiconductor element to be mounted on the holding portion; and a suspension lead extending outward from the holding portion, from opposite sides of the holding portion, for supporting the holding portion.

3 Claims, 10 Drawing Sheets

LEAD FRAME FOR SEMICONDUCTOR DEVICE

BACKGROUND OF THE INVENTION

1. Field of the Invention

The present invention relates to a lead frame and a resin-sealed semiconductor device using the lead frame.

2. Description of the Related Art

Conventionally, semiconductor devices mainly use a lead frame because it can be manufactured at high productivity and low cost as a wiring member for connecting the semiconductor device with an external circuit.

FIG. 17 is a top view of a resin-sealed semiconductor device using a conventional lead frame and FIG. 18 is a sectional view taken along the line XVIII—XVIII in FIG. 17 in the middle of the resin sealing process. In FIGS. 17 and 18, a semiconductor element 1 is mounted on a die pad 2 of a lead frame. The die pad 2 is supported by two suspension leads 3 from two directions. The semiconductor element 1 is secured to the die pad 2 by a bonding material 4. The semiconductor device is sealed by a sealing resin 5. As shown in FIG. 18, the flow length 6 of the sealing resin 5 on the semiconductor element 1 during the sealing resin process is longer than the flow length 7 of the sealing resin 5 under the die pad 2. Then, the semiconductor element 1 and die pad 2 are entirely sealed with the resin to form a semiconductor package 8. The semiconductor element 1 is held by the die pad 2 of the lead frame. An electrode formed on the semiconductor element 1 is bonded with an electrode of the lead frame by a thin metallic wire or the like and then, the thermosetting sealing resin 5 is injected and cured to form the semiconductor package 8. In FIG. 18, there is a difference equivalent to the thickness of the die pad 2 between the injection channel widths of the sealing resin 5 at the top and the bottom of the semiconductor element 1. Therefore, when injecting the resin, a difference is produced between the flow length 6 of the sealing resin 5 on the semiconductor element 1 and the flow length 7 of the sealing resin 5 under the die pad 2.

FIG. 19 is a top view of a resin-sealed semiconductor device using another conventional lead frame and FIG. 20 is a sectional view of the portion taken along the line XX—XX of FIG. 19 during the resin sealing process. In FIGS. 19 and 20, a suspension lead 9 of a lead frame supports a die pad 2 from four directions. Other structures are the same as those in FIGS. 17 and 18.

A resin-sealed semiconductor device using a conventional lead frame is constituted as described above. A lead frame is decreased in thickness as a semiconductor device is decreased in size and thickness and, moreover, a semiconductor element is increased in size as the semiconductor device is improved in function. Furthermore, there are problems that not only the lead frame but also semiconductor device components are deformed due to various stresses received in fabricating the semiconductor device and thereby, the quality and fabrication yield of semiconductor devices are deteriorated.

Particularly when sealing a semiconductor element with a resin by injection-molding and thermally curing a thermosetting resin in fabricating a semiconductor device, the thickness of the sealing resin is decreased due to a decrease in the semiconductor device thickness and a sealing-resin injection channel is narrowed in the thermosetting-resin injection molding process. Moreover, a difference in thickness equivalent to a die pad is produced between the channel thicknesses at the top and the bottom (that is, the bottom of the die pad 2) of a semiconductor element and, thereby, the sealing-resin flow velocity on the semiconductor element 1 is different from the sealing-resin flow velocity under the die pad 2. That is, as shown in FIG. 18, a difference is produced between the sealing-resin flow length 6 on the semiconductor element 1 and the sealing-resin flow length 7 under the die pad 2. Moreover, a difference is produced between the pressure applied to the semiconductor element 1 from the sealing resin 5 at the top and the pressure applied to the die pad 2 from the sealing resin 5 at the bottom. As a result, deformation of a lead frame having a semiconductor element and a die pad is induced. Furthermore, in the process for thermally curing the sealing resin 5, warpage or deformation occurs in a semiconductor package due to cured resin contraction because the amount of sealing resin on the semiconductor element 1 is different from the amount of sealing resin under the semiconductor element by an amount equivalent to the volume of the die pad 2.

SUMMARY OF THE INVENTION

The present invention is made to solve the above problems and its object is to provide a semiconductor device inhibiting a semiconductor device component such as a lead frame from deforming and being fabricated at a high yield and having a high reliability.

In order to achieve the above object, according to one aspect of the present invention, there is provided a lead frame comprising a frame portion, a holding portion whose area is smaller than the bottom area of a semiconductor element to be mounted, and a suspension lead portion provided between the frame portion and the holding portion extending outward from the opposite sides of the holding portion respectively to support the holding portion.

According to another aspect of the present invention, there is provided a lead frame, wherein the width of the suspension lead is increased.

According to still another aspect of the present invention, there is provided a lead frame, wherein a transition portion of a large radius of curvature is provided between the suspension lead portion and the holding portion.

According to a further aspect of the present invention, there is provided a lead frame, wherein the suspension lead portion is connected to a position including corners of the holding portion.

According to a still further aspect of the present invention, there is provided a lead frame, wherein the suspension lead portion is constituted so as to support the holding portion from four directions and so that the intersection between lines connecting two suspension lead portions not adjacent each other coincides with the intersection between diagonal lines of the outline of a semiconductor package.

According to another aspect of the present invention, there is provided a lead frame, wherein the lead frame has a mark for recognizing a semiconductor element mounting position.

According to still another aspect of the present invention, there is provided a lead frame, wherein the mark for recognizing a semiconductor element mounting position is any one of a notch, through-hole, recess, and pattern by plating formed on a suspension lead portion.

According to a further aspect of the present invention, there is provided a lead frame, wherein the mark for recognizing a semiconductor element mounting position has any one of a protrudent shape, stepwise shape and curved shape.

According to a still further aspect of the present invention, there is provided a semiconductor device comprising a lead frame comprising a holding portion whose area is smaller than the bottom area of a semiconductor element to be mounted and a suspension lead portion provided so as to extend outward from the opposite sides of the holding portion respectively, a semiconductor element mounted on the holding portion of the lead frame, and a sealing resin sealing the semiconductor element and constituting a semiconductor package.

DESCRIPTION OF THE PREFERRED EMBODIMENTS

Figure 1:
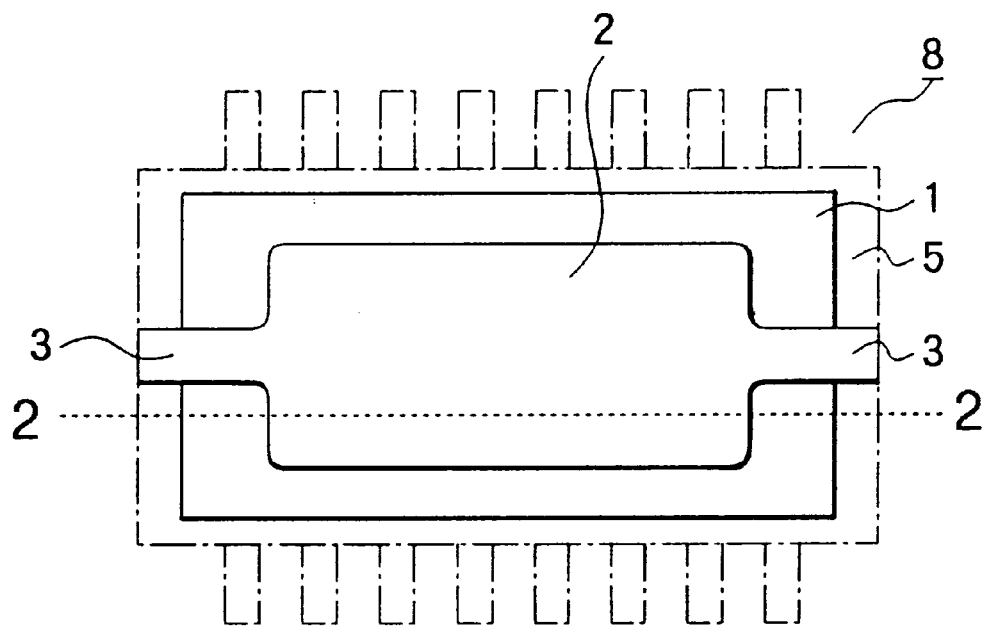
FIG. 1 is a top view showing the semiconductor device of embodiment 1 of the present invention.
Figure 2:
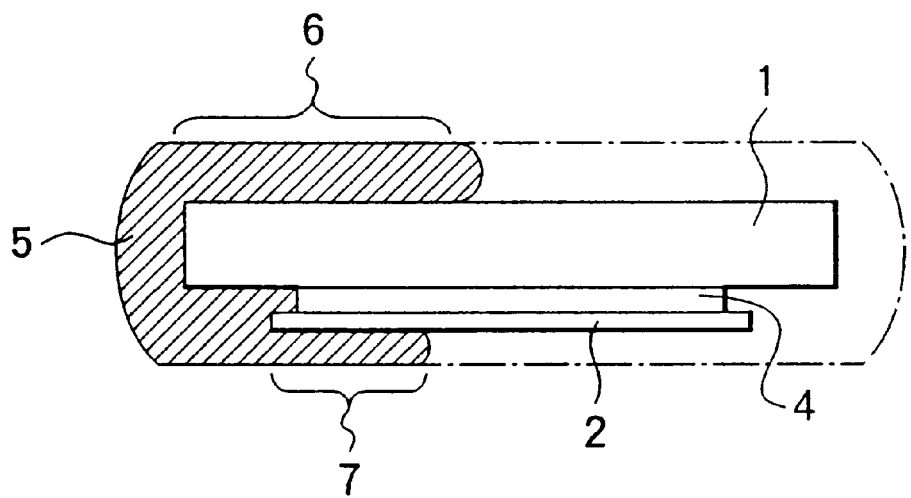
FIG. 2 is a sectional view showing the semiconductor device of the embodiment 1 of the present invention.

Embodiment 1:

The semiconductor device of an embodiment of the present invention is described below by referring to the accompanying drawings. FIG. 1 is a top view of the semiconductor device showing the embodiment 1 of the present invention and FIG. 2 is a sectional view of the portion taken along the line II—II in FIG. 1 during the resin sealing process. In FIGS. 1 and 2, a die pad 2 of a lead frame as a holding portion for mounting a semiconductor element 1 is decreased in size compared to a conventional one and is smaller than the bottom area of the semiconductor element 1. Moreover, two suspension leads 3 support the die pad 2 from two directions. The suspension lead 3 provided between a frame portion that is not shown and the die pad 2. The width of the suspension lead 3 is wide as compared with a conventional one. The length of the suspension lead 3 is made longer than a conventional one, consequently the width of the suspension lead 3 is increased so as to maintain its strength. The semiconductor element 1 is secured to the die pad 2 by a bonding material 4. The semiconductor device is sealed by a sealing resin 5. As shown in FIG. 2, the flow length 6 of the sealing resin 5 on the semiconductor element 1 during the sealing resin process is longer than the flow length 7 of the sealing resin 5 under the die pad 2 but the difference between the flow lengths is small. Moreover, the semiconductor element 1 and the die pad 2 are entirely sealed with resin to form a semiconductor package 8.

By decreasing the die pad 2 for holding the semiconductor element 1 in size compared to a conventional one and further decreasing the bottom area of the semiconductor element 1, it is possible to decrease the range of the difference in thickness between the channel for injecting the sealing resin 5 on top of the semiconductor element 1 and the channel thickness for injecting the sealing resin 5 under the die pad 2. Therefore, it is possible to decease the difference between the sealing-resin channel length 6 on the semiconductor element 1 and the sealing-resin channel length 7 under the die pad 2. Thus, the difference between pressures applied to the semiconductor element 1 and the die pad 2 from the top and the bottom sealing resins 5 is decreased and the semiconductor element 1 and the die pad 2 are inhibited from deforming. Moreover, because the injection channel of the sealing resin 5 is expanded, the injection velocity of the sealing resin 5 is increased and productivity is improved. Furthermore, in thermal curing of the sealing resin 5, the semiconductor package 8 is inhibited from deforming due to the difference in contraction due to a decrease in the difference between the amounts of sealing resins 5 at the top and the bottom of the semiconductor element 1.

Furthermore, by increasing the width of the suspension lead 3, the rigidity of a lead frame is increased and the lead frame is inhibited from deforming.

The present invention makes it possible to inhibit a semiconductor device component such as a lead frame from deforming in the resin sealing process of the semiconductor element 1, and moreover, to improve productivity and fabricate high-reliability semiconductor devices by decreasing the area of the die pad 2 and increasing the width of the suspension lead 3.

Figure 3:
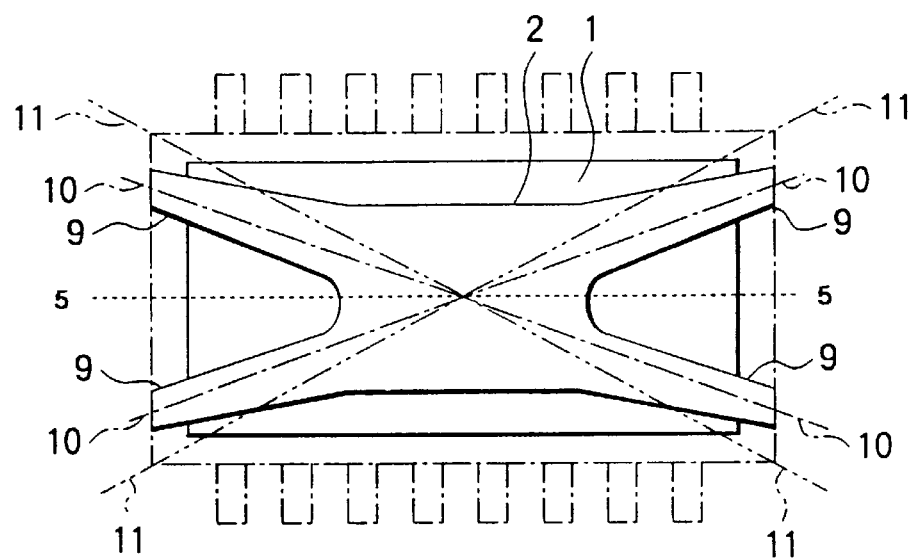
FIG. 3 is a top view showing the semiconductor device of embodiment 2 of the present invention.
Figure 4:
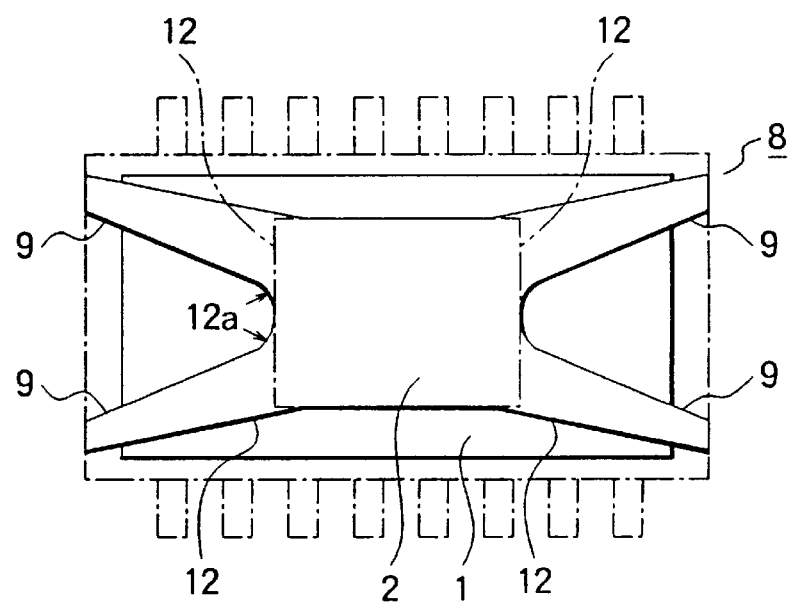
FIG. 4 is a top view showing the semiconductor device of the embodiment 2 of the present invention.
Figure 5:
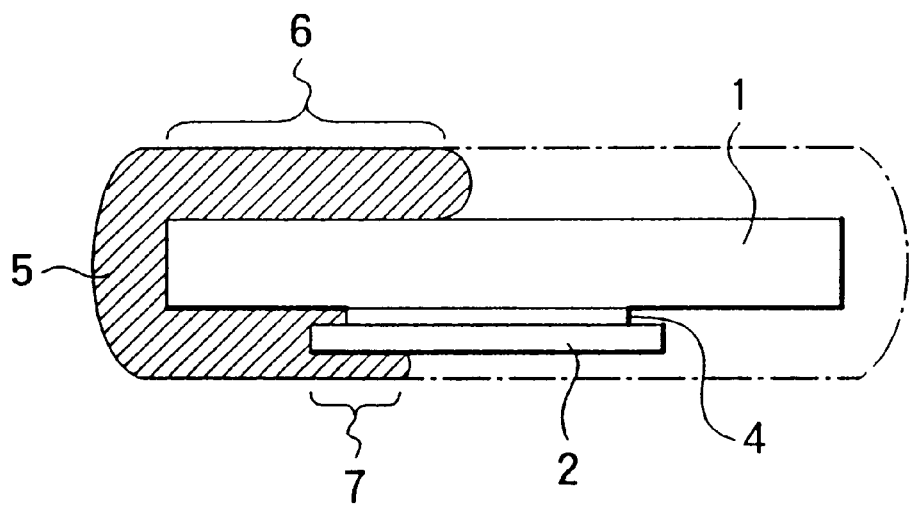
FIG. 5 is a sectional view showing the semiconductor device of the embodiment 2 of the present invention.

Embodiment 2:

FIGS. 3 and 4 are top views showing the semiconductor device of the embodiment 2 of the present invention and FIG. 5 is a sectional view of the portion taken along the line V—V of FIG. 3 during the resin sealing process. In FIGS.

3, 4, and 5, four suspension leads 9 suspending the die pad 2 from four directions are shown. The width of the suspension lead 9 is wide as compared with a conventional one. The intersection of lines 10 connecting two suspension leads 9 not adjacent each other among the four suspension leads 9 coincides with the intersection between diagonal lines 11 of a semiconductor package 8. The quadrangular die pad 2 has corners 12. Moreover side of the die pad 2 and the suspension lead 9 extend from the side at corner 12a. Because other elements are the same as those of the embodiment 1, their description is omitted.

By forming four suspension leads 9 for suspending the die pad 2 from four directions so as to make the intersection between the lines 10 connecting two suspension leads 9 not adjacent each other among the four suspension leads 9 coincide with the intersection between diagonal lines 11 of the semiconductor package 8, the rigidity of the semiconductor package 8 is increased and the package is inhibited from deforming due to a stress applied to the package in the semiconductor device fabrication process. Moreover, as shown in FIG. 4, four suspension leads 9 include respective corners 12 of the quadrangular die pad 2. Furthermore, forming the suspension lead 9 so that the corner 12a formed by one side of the die pad 2 and the suspension lead 9 extending from the side has a segmental shape with a large radius of curvature, the rigidity of a lead frame is increased and the lead frame is inhibited from deforming.

According to this embodiment, the same advantage as that of the embodiment 1 is obtained by decreasing the area of the die pad 2 and increasing the width of the suspension lead 9 and, moreover, it is possible to increase the rigidities of a lead and a semiconductor package by improving the shapes of the die pad 2 and the suspension lead 9. Therefore, a further advantage of inhibiting a semiconductor component, such as a lead frame, from deforming is obtained.

Figure 7:
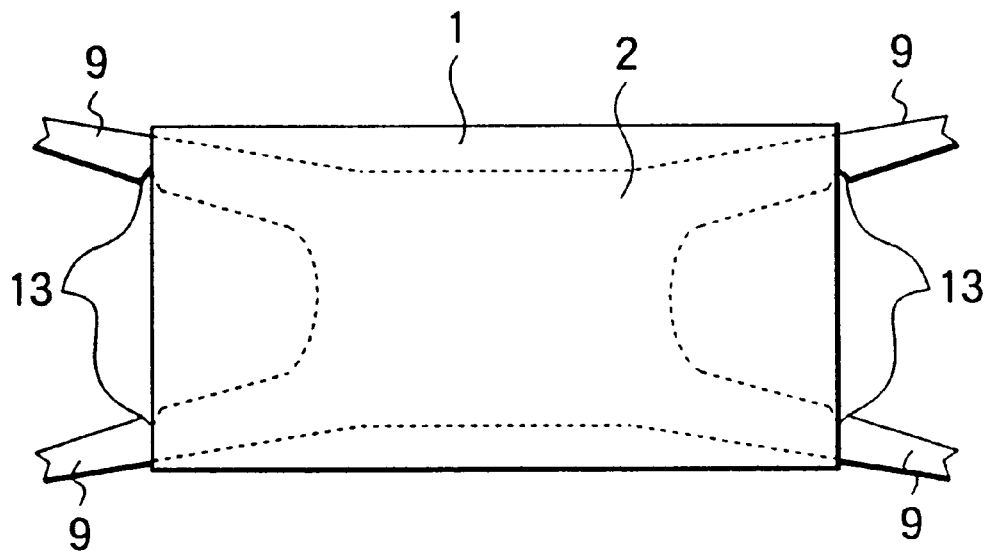
FIG. 7 is a top view showing a state of mounting a semiconductor element on the lead frame of the embodiment 3 of the present invention.

Embodiment 3:

FIG. 7 is a top view showing the state in which a semiconductor element is mounted on the lead frame of the embodiment 3 of the present invention. In FIG. 7, a notch 13 for recognizing a position on a lead frame for mounting a semiconductor element 1 is located on a suspension lead 9. Because other structures are the same as those of the embodiment 2, their description is omitted.

The notch 13 is located where the semiconductor element 1 is mounted on a position on the lead frame and intersects the suspension lead 9, which is located at one side or both sides of one suspension lead 9 and provided for at least two suspension leads 9 on one lead frame.

Figure 6:
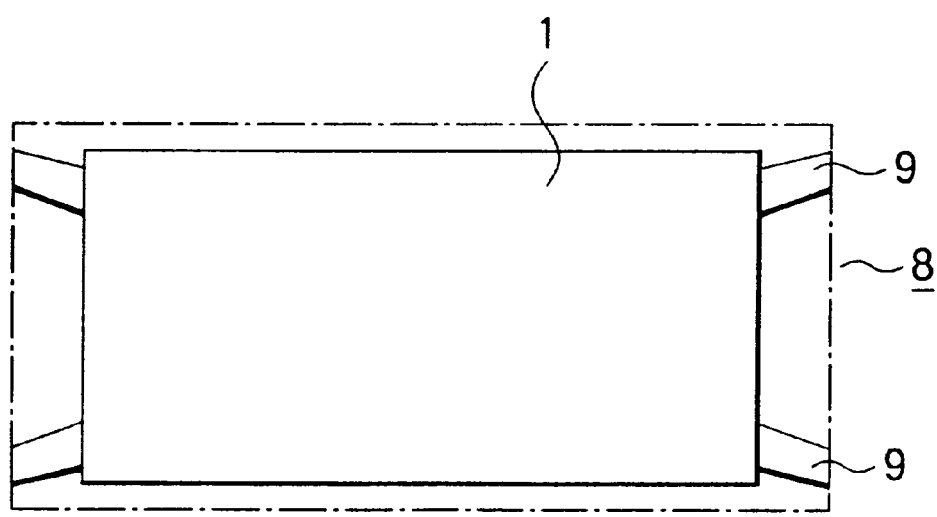
FIG. 6 is a top view showing a semiconductor device for explaining embodiment 3 of the present invention.

In the case of this embodiment, if a die pad 2 is smaller than the semiconductor element 1, the die pad 2 is hidden by the semiconductor element 1 as shown in FIG. 6 and, therefore, it is difficult to accurately recognize the relative position between the semiconductor element 1 and the lead frame after they are joined. Moreover, by locating the notch 13 on the suspension lead 9 of the lead frame, it is possible to accurately recognize a deviation of the semiconductor element 1 from a predetermined mounting position on the lead frame because the notch 13 serves as a mark for mounting the semiconductor element 1 on the lead frame in the step of bonding the semiconductor element 1 to the lead frame and, moreover to accurately position the semiconductor element 1 at a predetermined mounting position. Therefore, the productivity of a semiconductor device is improved and, moreover, it is possible to improve the reliability of the semiconductor device.

Figure 8:
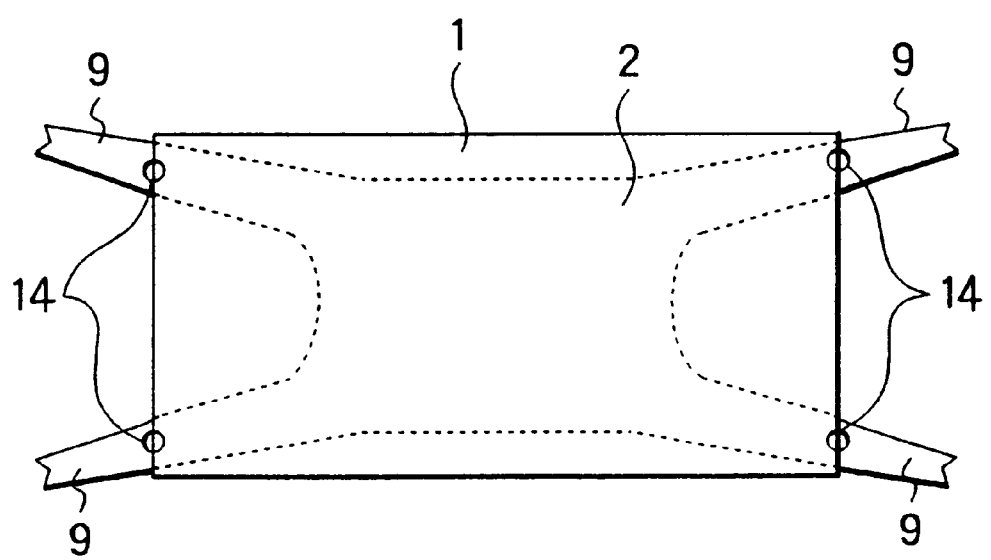
FIG. 8 is a top view showing a state of mounting a semiconductor element on the lead frame of the embodiment 4 of the present invention.
Figure 9:
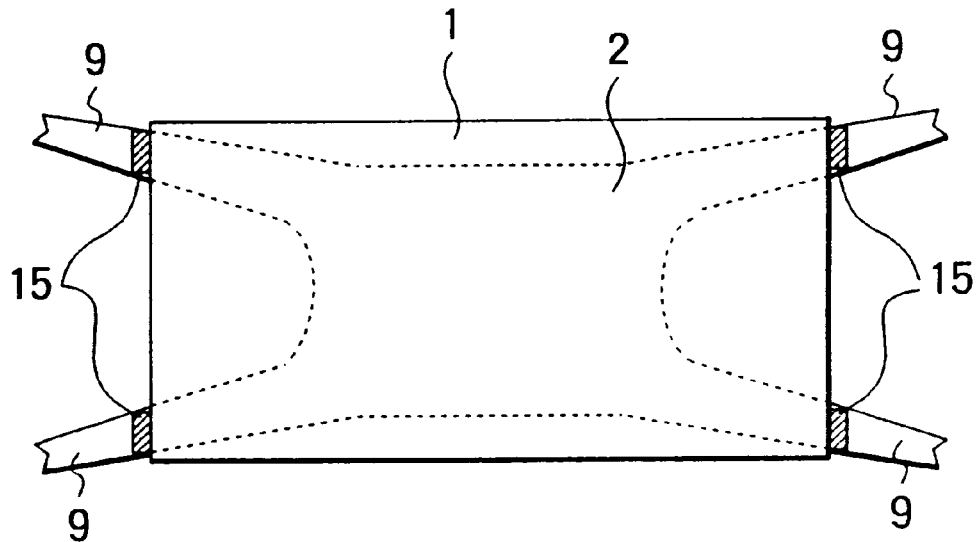
FIG. 9 is a top view showing a state of mounting a semiconductor element on the lead frame of the embodiment 4 of the present invention.
Figure 10:
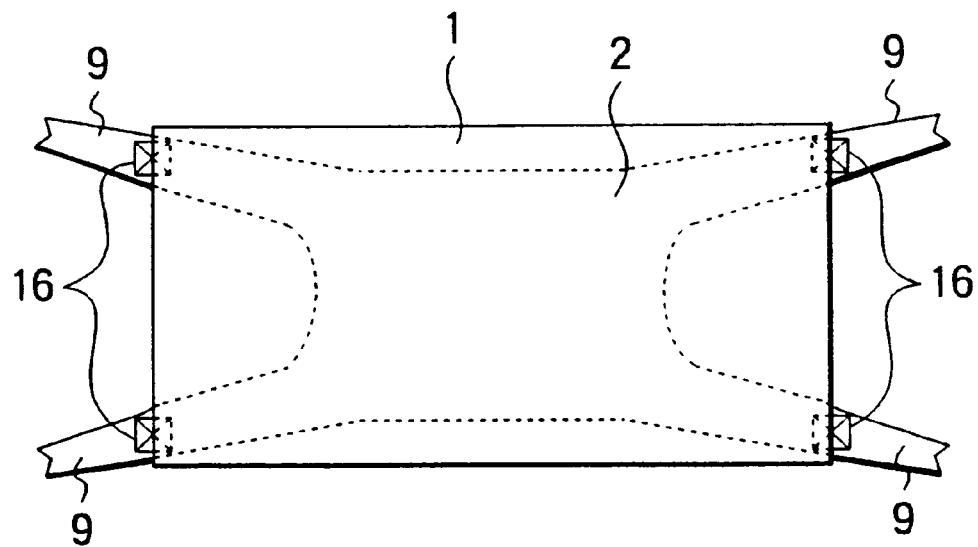
FIG. 10 is a top view showing a state of mounting a semiconductor element on the lead frame of the embodiment 4 of the present invention.

Embodiment 4:

In the case of the embodiment 3, the notch 13 is located to recognize the mounting position of the semiconductor element 1 on the lead frame. Moreover, as shown in FIG. 10, by locating a through-hole 14 at a portion where the semiconductor element 1 intersects a suspension lead 9 when mounted at a predetermined position of the lead frame as shown in FIG. 8, by forming a groove 15 by half etching on the portion as shown in FIG. 9, or by forming a recess 16 by machining the portion, the same advantage as that of the embodiment 3 is obtained.

It is enough to form the through-hole 14, groove 15, or recess 16 on at least two suspension leads 9 on one lead frame.

Figure 11:
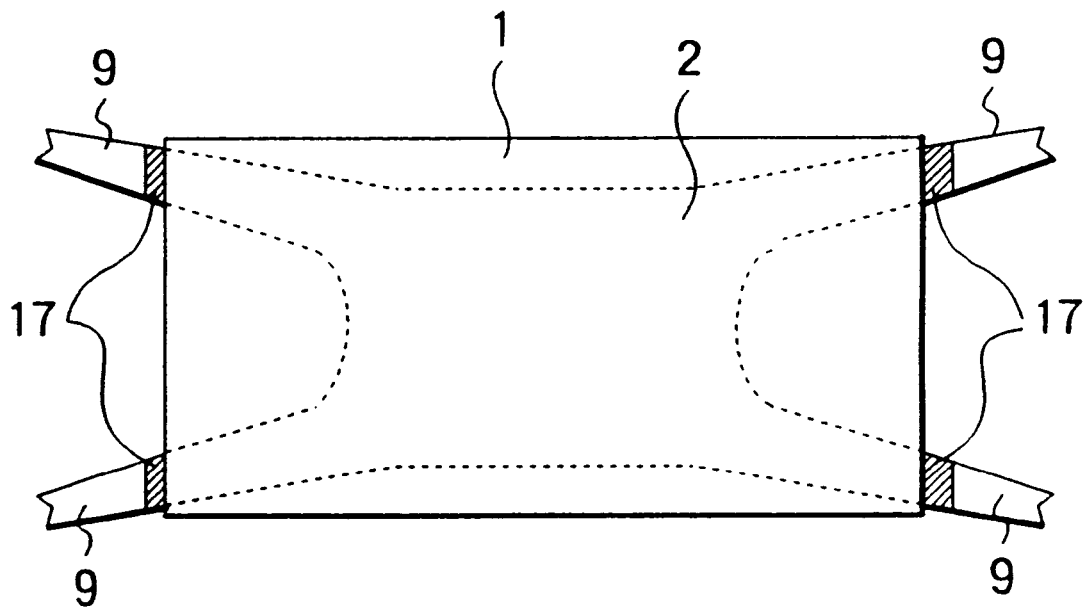
FIG. 11 is a top view showing a state of mounting a semiconductor element on the lead frame of embodiment 5 of the present invention.

Embodiment 5:

In the case of the embodiment 3, the notch 13 is formed for recognizing the mounting position of the semiconductor element 1 on the lead frame. Moreover, as shown in FIG. 11, by forming a plating pattern 17, at a portion where a semiconductor element 1 intersects a suspension lead 9 mounted on a predetermined position of the lead frame, the same advantage as that of the embodiment 3 is obtained.

Moreover, by plating the region other than the plating pattern 17 instead of forming the pattern 17 as a cutout pattern, the same advantage is obtained.

Figure 12:
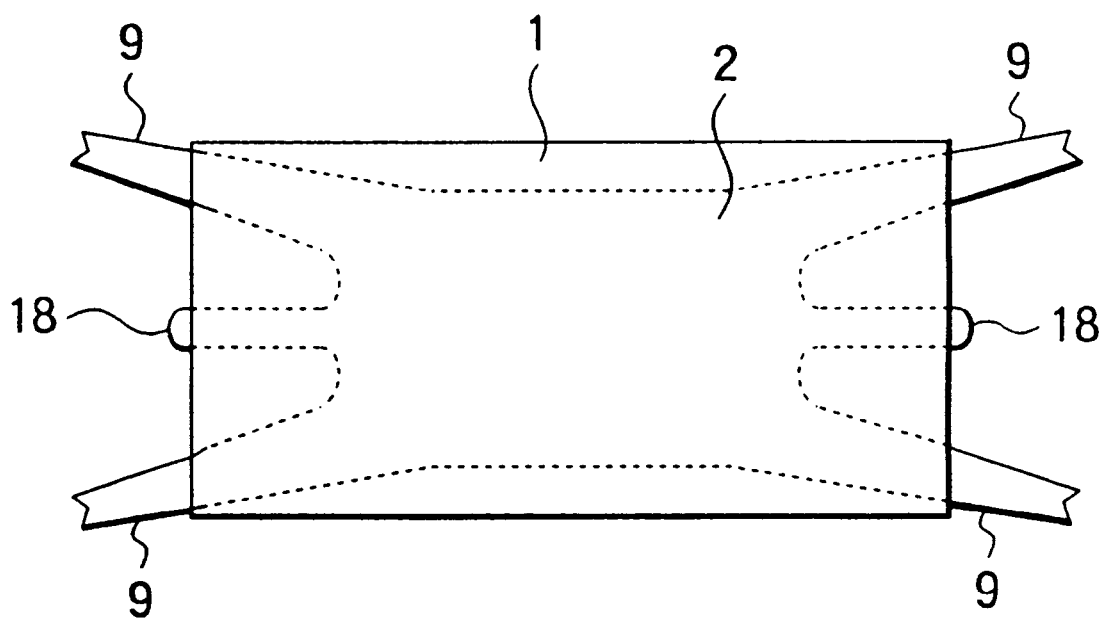
FIG. 12 is a top view showing a state of mounting a semiconductor element on the lead frame of embodiment 6 of the present invention.

Embodiment 6:

In the case of the embodiment 3, the notch 13 is located on the suspension lead 9 for recognizing the mounting position of the semiconductor element 1 on the lead frame. Moreover, as shown in FIG. 12, by extending a protrusion 18 to a portion where the protrusion 18 is not hidden when the semiconductor element 1 is mounted at a predetermined position of a lead frame, the same advantage as that of the embodiment 3 is obtained.

It is necessary to form the protrusion 18 at at least two positions on one lead frame.

Figure 13:
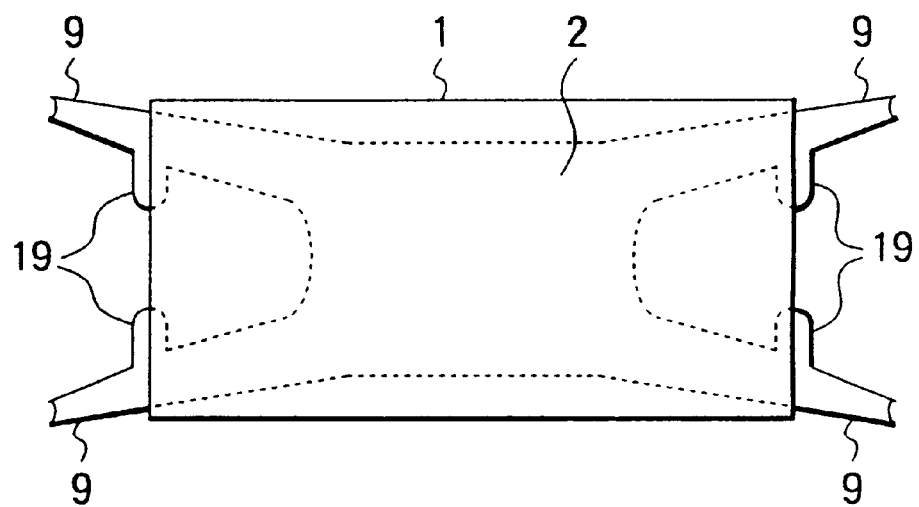
FIG. 13 is a top view showing a state of mounting a semiconductor element on the lead frame of embodiment 7 of the present invention.

Embodiment 7:

In the case of the embodiment 3, the notch 13 is located on the suspension lead 9 for recognizing the mounting position of the semiconductor element 1 on the lead frame. Moreover, as shown in FIG. 13, by extending a protrusion 19 from a suspension lead 9 where a semiconductor element 1 intersects a suspension lead 9 when the semiconductor element 1 is mounted at a predetermined position on the lead frame, the same advantage as that of the embodiment 3 is obtained.

The protrusion 19 is located at one side or both sides of one suspension lead 9 and it is necessary to form a protrusion 19 on at least two suspension leads 9 on one lead frame.

Figure 14:
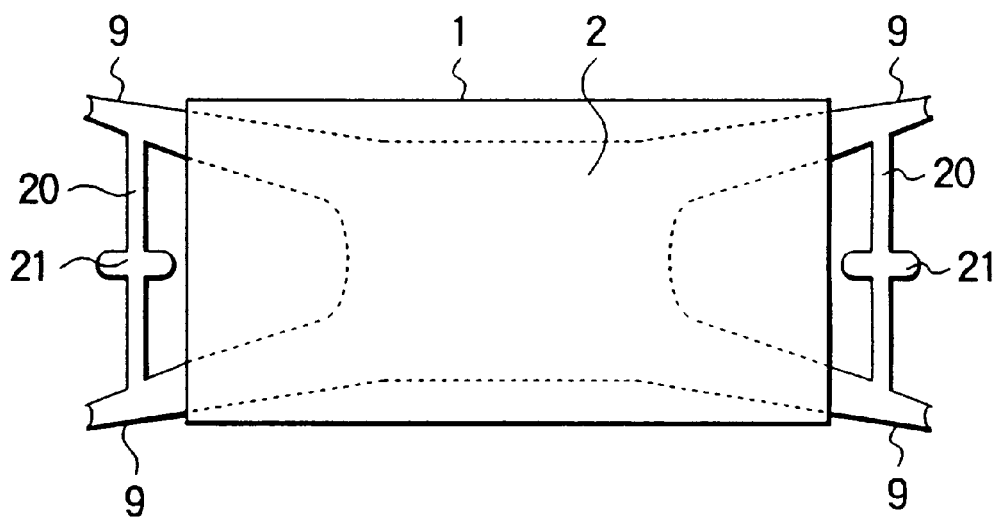
FIG. 14 is a top view showing a state of mounting a semiconductor element on the lead frame of embodiment 8 of the present invention.

Embodiment 8:

In the case of the embodiment 3, the notch 13 is located on the suspension lead 9 for recognizing the mounting position of the semiconductor element 1 on the lead frame. Moreover, as shown in FIG. 14, by forming a bridge 20 between two suspension leads 9 adjacent each other at a position where the bridge 20 is not hidden by a semiconductor element 1 when the element 1 is mounted at a predetermined position of the lead frame and, moreover, forming a protrusion 21 at one side or both sides of the bridge 20, the same advantage as that of the embodiment 3 is obtained.

It is necessary to include the bridge 20 at two positions between different suspension leads 9 on one lead frame. Moreover, even if the bridge 20 is located at a position where the bridge 20 is hidden by the semiconductor element 1, the same advantage is obtained if the bridge 20 is located at a position where the protrusion 21 protrudes from the semiconductor element 1.

Figure 15:
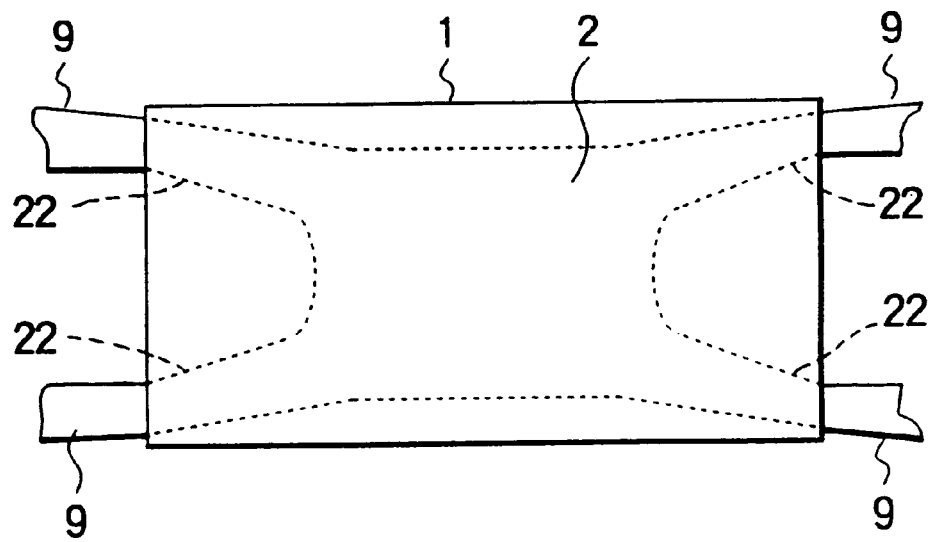
FIG. 15 is a top view showing a state of mounting a semiconductor element on the lead frame of embodiment 9 of the present invention.

Embodiment 9:

In the case of the embodiment 3, the notch 13 is located on the suspension lead 9 for recognizing the mounting position of the semiconductor element 1 on the lead frame. Moreover, as shown in FIG. 15, by including a band 22 on a suspension lead 9 where a semiconductor element 1 is mounted at a predetermined position of the lead frame and intersecting the suspension lead 9, the same advantage as that of the embodiment 3 is obtained.

It is necessary to set the angle of the band 22 to a value at which the band 22 can be recognized on the suspension lead 9.

Figure 16:
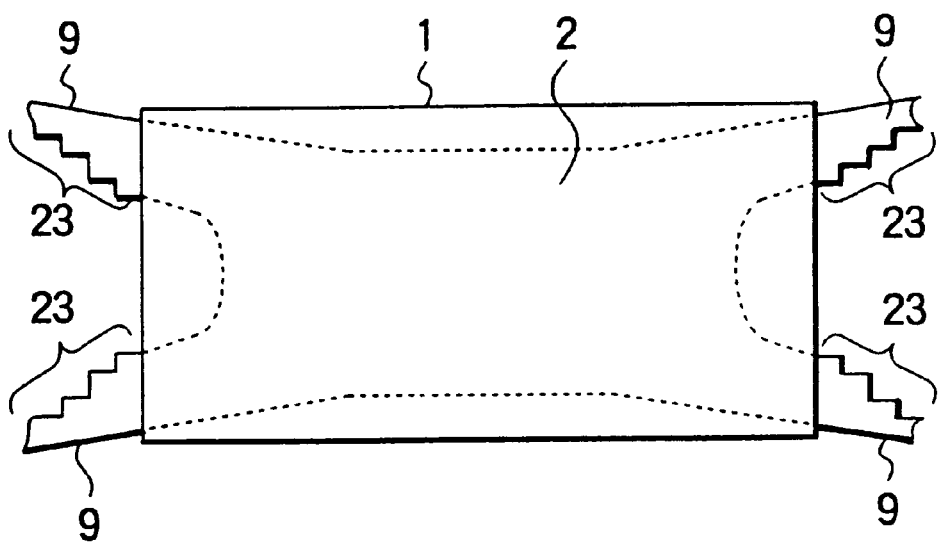
FIG. 16 is a top view showing a state of mounting a semiconductor element on the lead frame of embodiment 10 of the present invention.
Figure 17:
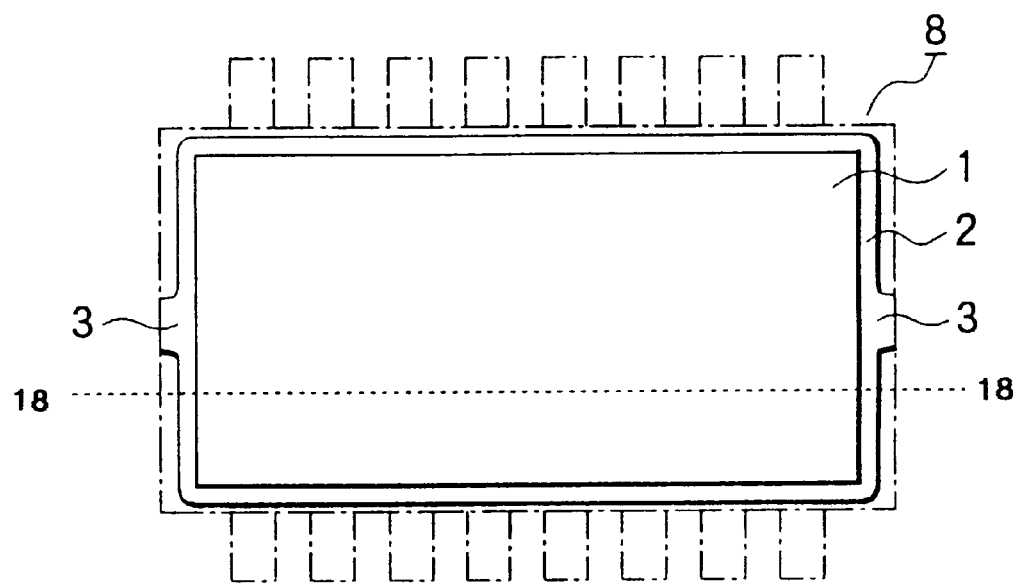
FIG. 17 is a top view showing of a conventional semiconductor device.
Figure 18:
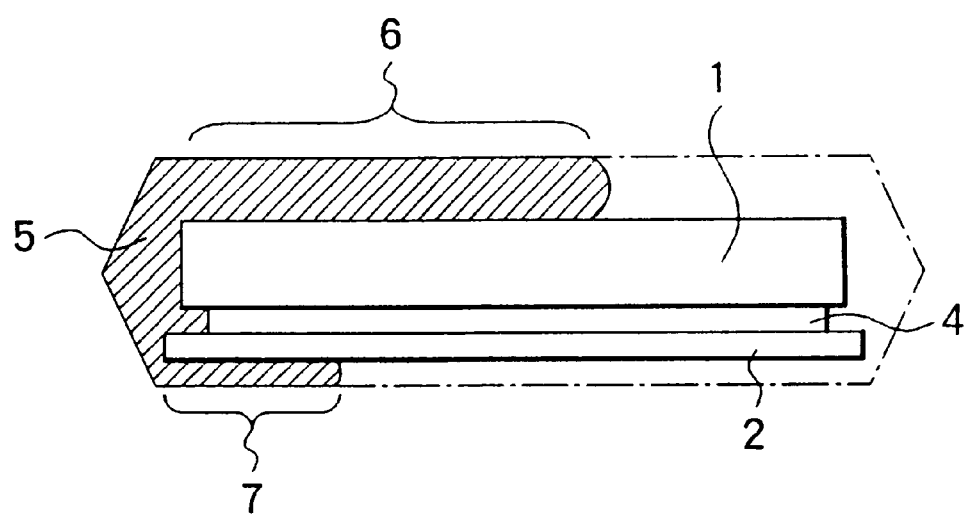
FIG. 18 is a sectional view showing a conventional semiconductor device.
Figure 19:
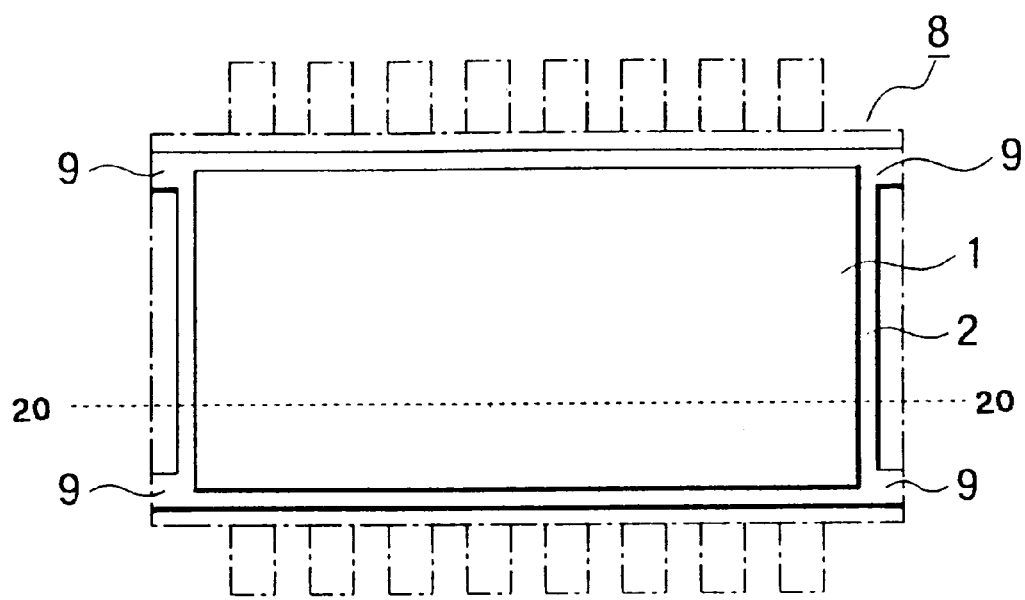
FIG. 19 is a top view showing another conventional semiconductor device.
Figure 20:
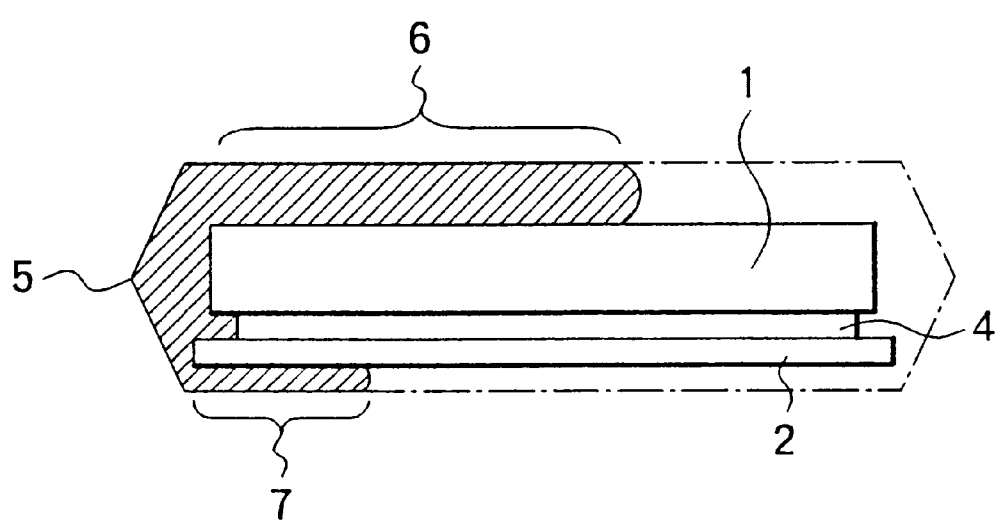
FIG. 20 is a sectional view showing still another semiconductor device.

Embodiment 10:

FIG. 16 is a top view showing the state in which a semiconductor element is mounted on the lead frame of the embodiment 10 of the present invention. A suspension lead 9 of the lead frame of this embodiment has a stepwise shape 23. Because other structures are the same as those of the embodiment 2, their description is omitted.

According to this embodiment, because the suspension lead 9 has the stepwise shape 23, it is possible to recognize the mounting position of a semiconductor element 1 with a different size on the lead frame and the same advantage as that of the embodiment 3 is obtained for the semiconductor element 1 with a different size.

As described above, the present invention makes it possible to moderate a stress applied to a semiconductor device component such as a lead frame in the process of resin sealing a semiconductor element to increase the resin sealing velocity and to improve productivity by decreasing the area of a die pad for holding the semiconductor element. Moreover it is possible to increase the rigidities of a lead frame and a semiconductor package by increasing the width of a suspension lead and adjusting the positional relation between the die pad and the suspension lead. Therefore, it is possible to inhibit a semiconductor device component, such as a lead frame from deforming and to form a high-reliability semiconductor device at a high yield.

Moreover, by forming a mark for mounting a semiconductor element on a lead frame in the step of bonding the semiconductor element to the lead frame, it is possible to accurately recognize a deviation of the semiconductor element from a predetermined mounting position and to improve productivity and the reliability of a semiconductor device.

What is claimed is:

1. A lead frame comprising:

a generally rectangular holding portion having an area smaller than an area of a semiconductor element to be mounted on the holding portion; and four suspension leads extending outwardly from respective corners of the holding portion supporting the holding portion, wherein each of the suspension leads includes a marker positioned so that each marker is crossed by an edge of a semiconductor element centrally mounted on the holding portion, whereby proper positioning of the semiconductor element on the holding portion can be easily confirmed, all markers on a lead frame are identical, and each marker is a plated pattern.

2. A lead frame comprising:

a generally rectangular holding portion having an area smaller than an area of a semiconductor element to be mounted on the holding portion; and four suspension leads extending outwardly from respective corners of the holding portion for supporting the holding portion, wherein each of the suspension leads includes a marker positioned so that each marker is crossed by an edge of a semiconductor element centrally mounted on the holding portion, whereby proper positioning of the semiconductor element on the holding portion can be easily confirmed, all markers on a lead frame are identical, and each marker is a protrusion extending from and transverse to the suspension lead.

3. A lead frame comprising:

a generally rectangular holding portion having an area smaller than an area of a semiconductor element to be mounted on the holding portion; and four suspension leads extending outwardly from respective corners of the holding portion for supporting the holding portion, wherein each of the suspension leads includes a marker positioned so that each marker is crossed by an edge of a semiconductor element centrally mounted on the holding portion, whereby proper positioning of the semiconductor element on the holding portion can be easily confirmed, all markers on a lead frame are identical, and each marker is a serration including multiply stepped protrusions transverse to the suspension lead.

* * * * *